United States Patent
Ko

(10) Patent No.: US 7,253,533 B2
(45) Date of Patent: Aug. 7, 2007

(54) DIVIDED SHADOW MASK FOR FABRICATING ORGANIC LIGHT EMITTING DIODE DISPLAYS

(75) Inventor: Chung-Wen Ko, Sijhih (TW)

(73) Assignee: AU Optronics Corporation, Hsinchu (TW)

( * ) Notice: Subject to any disclaimer, the term of this patent is extended or adjusted under 35 U.S.C. 154(b) by 318 days.

(21) Appl. No.: 10/839,532

(22) Filed: May 6, 2004

(65) Prior Publication Data

US 2005/0250228 A1    Nov. 10, 2005

(51) Int. Cl.
*H01L 23/544* (2006.01)
(52) U.S. Cl. ............................ 257/797; 257/E21.056
(58) Field of Classification Search ................ 257/797, 257/E21.036
See application file for complete search history.

(56) References Cited

U.S. PATENT DOCUMENTS

| | | | | |
|---|---|---|---|---|
| 6,255,775 | B1 | 7/2001 | Ikuko et al. | 313/506 |
| 6,384,529 | B2 | 5/2002 | Tang et al. | 313/506 |
| 6,610,554 | B2 | 8/2003 | Yi et al. | 438/33 |
| 2004/0021410 | A1* | 2/2004 | Stagnitto et al. | 313/407 |
| 2004/0197972 | A1* | 10/2004 | Adachi et al. | 438/166 |

* cited by examiner

*Primary Examiner*—Bradley K. Smith
(74) *Attorney, Agent, or Firm*—Duane Morris LLP

(57) ABSTRACT

A divided shadow mask for use in fabricating an organic light emitting diode display including a first shadow mask section having a plurality of openings; and at least a second shadow mask section having a plurality of openings.

19 Claims, 3 Drawing Sheets

DIVIDED SHADOW MASK FOR FABRICATING ORGANIC LIGHT EMITTING DIODE DISPLAYS

FIELD OF INVENTION

The present invention relates to electronic display fabrication, and more particularly to a divided shadow mask for used in fabricating an organic light emitting diode display.

BACKGROUND OF THE INVENTION

Organic light emitting diodes (OLEDs) utilize thin film materials which emit light when excited by electric current. This makes OLEDs a popular alternative technology for flat panel displays.

OLEDs may be fabricated using shadow mask deposition technology. In shadow mask deposition, organic-based films, which form red, green, and blue (R, G, B) OLED pixels, may be deposited in a vacuum over the parallel arrays of transparent anode strips using a shadow mask 20 as shown in FIG. 1. The shadow mask 20 has a plurality of openings 22 through which the films of the OLEDs are evaporated over the arrays of transparent anodes disposed on a transparent substrate 10.

In order to lower fabrication costs, the transparent substrates on which the OLEDs are fabricated are increasing in size. This allows a plurality of display panels to be fabricated from a single substrate. In order to process these larger substrates, the shadow masks have also been enlarged. However, these larger shadow masks tend to sag toward their centers, thus loosing dimensional accuracy.

Accordingly, a shadow mask is needed which does not sag toward the center thereof.

SUMMARY OF INVENTION

A divided shadow mask is disclosed herein for use in fabricating an organic light emitting diode display. The divided shadow mask includes a first shadow mask section having a plurality of openings and at least a second shadow mask section having a plurality of openings.

DETAILED DESCRIPTION OF THE INVENTION

The present invention is a divided shadow mask for use in fabricating organic light emitting diode (OLED) displays on relatively large substrates, for example, substrate that are greater than 400×400 millimeters (mm).

Figure 1:
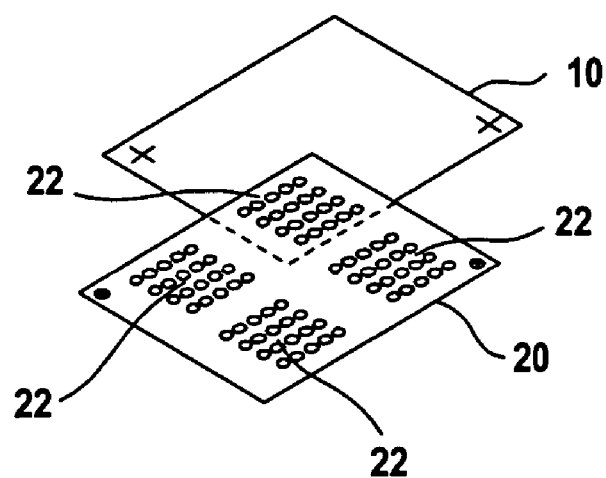
FIG. 1 is a schematic perspective view of a conventional shadow mask aligned with a substrate.
Figure 2:
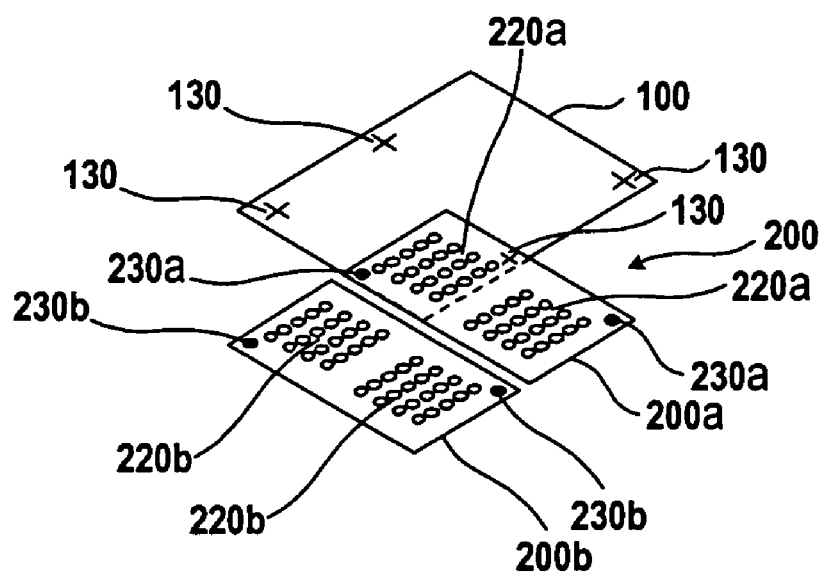
FIG. 2 is a schematic perspective view of an exemplary embodiment of a divided shadow mask according to the present invention, aligned with a substrate.

FIG. 2 shows an exemplary embodiment of the divided shadow mask 200 of the present invention. The divided shadow mask 200 is formed by two or more substantially identical planar, shadow mask sections, the exact number of which depends upon the size of the substrate to be processed. The divided shadow mask 200 avoids the problem of sagging, which is typical of large, prior art shadow masks. In the embodiment shown in FIG. 2, the divided shadow mask 200 is formed by first and second shadow mask sections 200a, 200b.

The shadow mask sections 200a, 200b may each be made from a sheet of stainless steel having a thickness less than about 100 microns. The shadow mask sections 200a, 200b may be rectangular in shape and dimensioned to overlap the areas where their associated display panels are to be formed. One or more mask patterns formed by a plurality of openings 220a, 220b are defined in each of the mask sections 200a, 200b. The films of the OLEDs are deposited through these openings 220a, 220b. Each shadow mask section 200a, 200b has its own alignment system, e.g., a CCD microscope, which allows the mask section to be independently translated in an x and y directions and independently tilted relative to the substrate at an angle θ. Aligning marks 230a, 230b may be provided at two or more corners of each of the shadow mask sections 200a, 200b, as in the shown embodiment, or be provided at other areas of the mask sections 200a, 200b. The alignment marks 230a, 230b are aligned with corresponding alignment marks 130 provided on the substrate 100 to correctly align each of the shadow mask sections 200a, 200b with the substrate 100, thus aligning the mask pattern openings 220a, 220b with the arrays of anodes (not shown for purposes of clarity) formed on the substrate 100 prior to deposition.

The divided shadow mask 200 will now be described with reference to the fabrication of a bottom emission OLED pixel structure wherein light emerges from the bottom of the pixel structure. It should be understood, however, that other OLEDs pixel structures including top emission structures (with light emerging from the top of the pixel) can also be fabricated by one skilled in the art using the divided shadow mask of the invention.

Figure 4A:
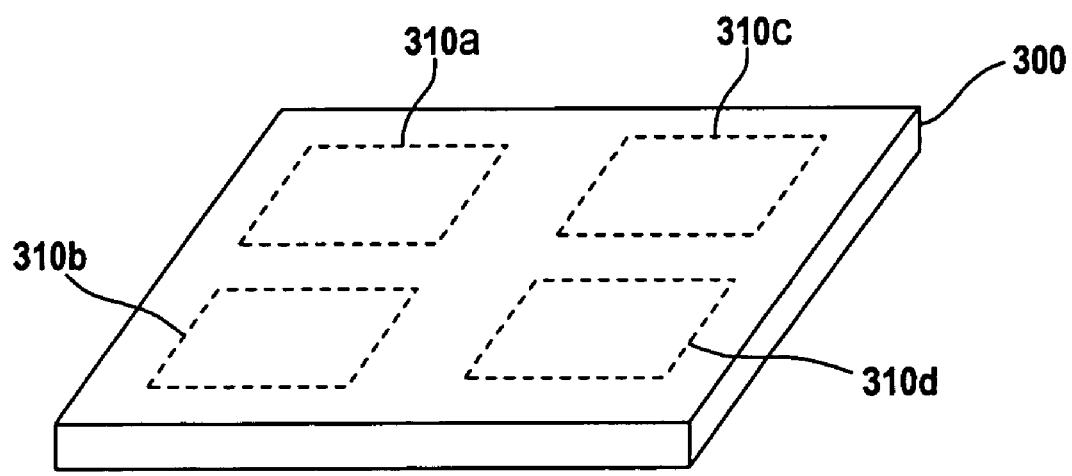
FIGS. 4A and 4B are perspective views showing how the divided shadow mask of the present invention may be used in the fabrication of a organic light emitting diode pixel structure.

Fabrication commences in FIG. 4A with a transparent substrate 300, made for example, of glass, that is coated with a transparent conductive layer. The transparent conductive layer may comprise a thin film of indium-tin-oxide (ITO) that may be formed on the substrate 300 in a vacuum using conventional sputtering or electron beam methods. The substrate 300 is dimensioned so that one or more display panels can be fabricated from a single substrate. As shown in FIG. 4A, the substrate 300 is dimensioned for fabricating four, discrete display panels 310a, 310b, 310c, 310c (show with broken lines for illustrative purposes only). In one exemplary embodiment, the four panel substrate 300 may be about 600 mm×700 mm. Substrates having other dimensions are also possible.

The transparent conductive layer is patterned using conventional photolithography into four separate parallel arrays of anodes (not shown), each of which will eventually form one of the four, discrete display panels 310a, 310b, 310c, 310d.

Figure 4B:
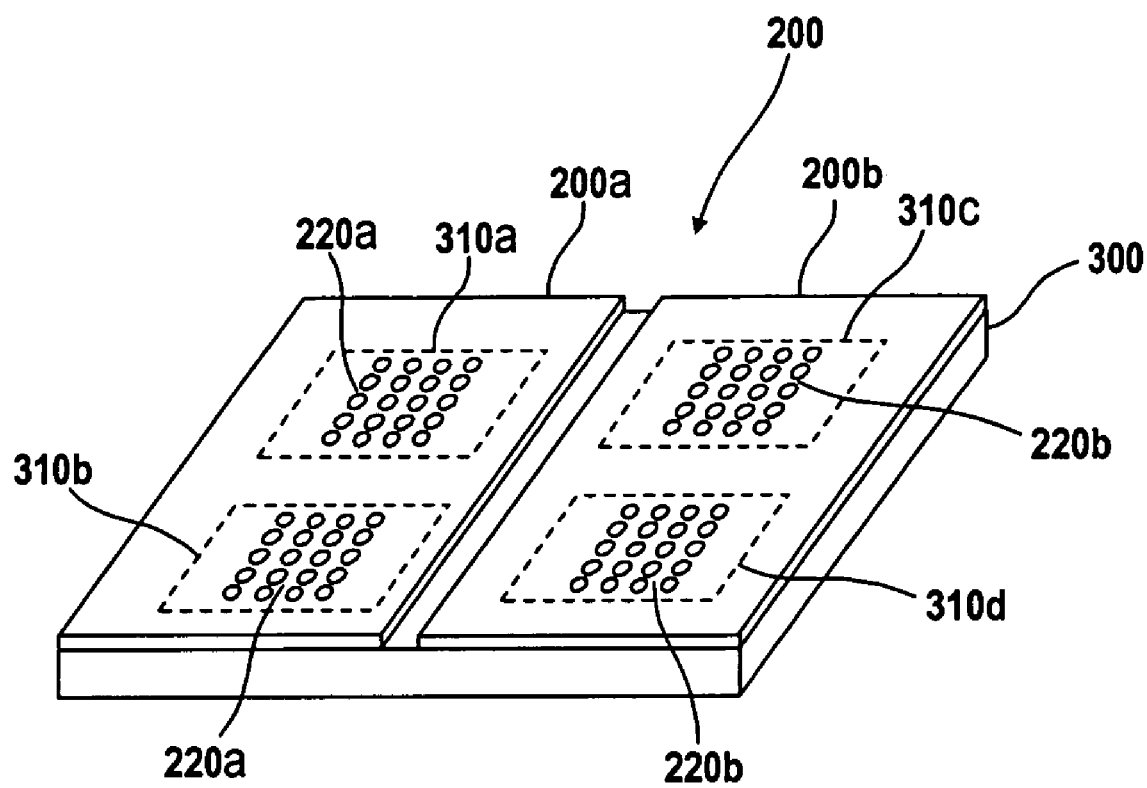

The organic-based films, which form red, green, and blue (R, G, B) OLED pixels, may then be deposited in a vacuum over the arrays of transparent anodes using the divided shadow mask 200 of the invention, as shown in FIG. 4B. The shadow mask sections 200a, 200b should be separated from one another by a small gap G. The gap G should be as small as possible to maximize the active area. In the shown embodiment, each of the shadow mask sections 200a, 200b is used for forming two of the four display panels. One of ordinary skill in the art will appreciate that the shadow mask sections 200a, 200b of the divided shadow mask 200 may also be adapted for forming other numbers of display panels.

Figure 3:
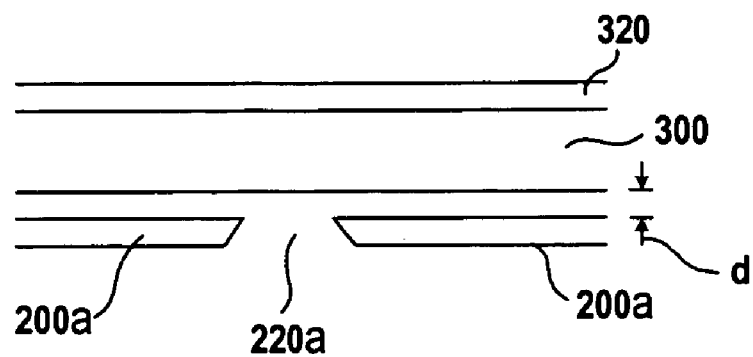
FIG. 3 is a sectional view showing one of the shadow mask sections of the divided shadow mask of the present invention disposed over a substrate.

The divided shadow mask 200 is selectively placed over the arrays of anodes using the alignment marks (see FIG. 2) to correctly align the shadow mask sections 200a, 200b with the substrate 300. As shown in FIG. 3, a layer of magnetic material may 320 be disposed on the side of the substrate 300 opposite to the anode arrays to attract the shadow mask sections 200a, 200b to the substrate 300. The shadow mask sections 200a, 200b are disposed in the same plane and substantially on the substrate 300.

One or more organic emissive layers for producing OLED pixels of a first one of the R, G, B colors are sequentially deposited in a vacuum through the openings 220a, 220b of the shadow mask sections 200a, 200b. The one or more organic emissive layers are then topped with a metal layer. The layers may be deposited by any one of a number of conventional directional deposition techniques including without limitation, physical vapor deposition, ion beam deposition, electron beam deposition, and sputtering The shadow mask sections 200a, 200b are then each shifted in the x and y directions so that one or more organic emissive layers for producing OLED pixels of a second one of the R, G, B colors may be sequentially deposited in a vacuum using substantially the same shadow masking and deposition techniques as those used to fabricate the OLED pixels of the first one of the R, G, B colors. On the other hand, specific masks for R, G, B colors deposition can be used in different chambers.

The shadow mask sections 200a, 200b are then each shifted again in the x and y directions so that one or more organic emissive layers for producing OLED pixels of the remaining one of the R, G, B colors may be sequentially deposited in a vacuum using substantially the same shadow masking and deposition techniques as those used to fabricate the OLED pixels of the other R, G, B colors.

The substrate 300 is then diced to separate the individual display panels 310a, 310b, 310c, 310d from one another. Dicing may be performed using any suitable method.

While the foregoing invention has been described with reference to the above, various modifications and changes can be made without departing from the spirit of the invention. Accordingly, all such modifications and changes are considered to be within the scope of the appended claims.

What is claimed is:

1. A divided shadow mask for use in fabricating an organic light emitting diode display, the divided shadow mask comprising at least two shadow mask sections having a plurality of openings, wherein the shadow mask sections include an alignment system for allowing the shadow mask sections to be independently translated in x and y directions and independently tilted relative to a substrate to be processed using the divided shadow mask.

2. The divided shadow mask according to claim 1, wherein the shadow mask sections can be titled relative to the substrate from an angle.

3. The divided shadow mask according to claim 1, wherein the shadow mask sections comprise a plurality of first marks and the substrate comprises a plurality of second marks.

4. The divided shadow mask according to claim 3, wherein the alignment system works according the first marks and the second marks.

5. The divided shadow mask according to claim 1, wherein the shadow mask sections include aligning marks for aligning the shadow mask sections with a substrate to be processed using the divided shadow mask.

6. A method of fabricating the organic light emitting diode display using the divided shadow mask of claim 1, the method comprising:

forming at least one array of anodes on a substrate;
aligning the divided shadow mask with the substrate; and
depositing at least one organic-based light emitting film over the array of anodes through the openings of the divided shadow mask.

7. The method according to claim 6, wherein the shadow mask sections are disposed in a same plane.

8. The method according to claim 6, wherein the shadow mask sections are separated.

9. The method according to claim 6, further comprising depositing at least one metal film over the organic-based light emitting films through the openings of the divided shadow mask.

10. The method according to claim 6, wherein the substrate is transparent.

11. The method according to claim 6, wherein the shadow mask sections comprise a plurality of first marks and the substrate comprises a plurality of second marks.

12. A method of fabricating a display using the divided shadow mask of claim 1, the method comprising:

forming at least one array of anodes on a substrate;
providing the divided shadow mask;
aligning each of the shadow mask sections with the substrate in a first position;
depositing at least one organic-based light emitting film with a first color through the openings of the shadow mask sections; and
depositing at least one organic-based light emitting film of a second color through the openings of the shadow mask sections.

13. The method according to claim 12, further comprising:

depositing at least one organic-based light emitting film of a third color through the openings of the shadow mask sections.

14. The method according to claim 13, further comprising:

depositing a metal film through the openings of the shadow mask sections over the organic-based light emitting film of the first color;
depositing a metal film through the openings of the shadow mask sections over the organic-based light emitting film of the second color; and
depositing a metal film Through the openings of the shadow mask sections over the organic-based light emitting film of the third color.

15. The method according to claim 12, wherein the shadow mask sections are disposed in a same plane.

16. The method according to claim 15, wherein the shadow mask sections are separated.

17. The method according to claim 12, further comprising:

depositing a metal film through the openings of the shadow mask sections over the organic-based light emitting film of the first color; and
depositing a metal film through the openings of the shadow mark sections over the organic-based light emitting film of the second color.

18. The method according to claim 12, wherein the substrate is at least about 600 mm×700 mm.

19. The method according to claim 12, wherein the shadow mask sections comprise a plurality of first marks and the substrate comprises a plurality of second marks.

* * * * *

UNITED STATES PATENT AND TRADEMARK OFFICE
CERTIFICATE OF CORRECTION

| | | |
|---|---|---|
| PATENT NO. | : 7,253,533 B2 | Page 1 of 1 |
| APPLICATION NO. | : 10/839532 | |
| DATED | : August 7, 2007 | |
| INVENTOR(S) | : Chung-Wen Ko | |

It is certified that error appears in the above-identified patent and that said Letters Patent is hereby corrected as shown below:

Column 4, line 44 in Claim 14, replace "Through" with --through--

Column 4, line 57 in Claim 17, replace "mark" with --mask--

Signed and Sealed this

Thirteenth Day of November, 2007

JON W. DUDAS
*Director of the United States Patent and Trademark Office*